(12) United States Patent
Yang (10) Patent No.: US 6,174,790 B1
(45) Date of Patent: Jan. 16, 2001

(54) METHOD OF CRYSTALLIZING AMORPHOUS SILICON LAYER

(75) Inventor: Myoung-Su Yang, Anyang (KR)

(73) Assignee: LG. Philips LCD Co., Ltd., Seoul (KR)

(*) Notice: Under 35 U.S.C. 154(b), the term of this patent shall be extended for 0 days.

(21) Appl. No.: 09/211,920

(22) Filed: Dec. 15, 1998

(30) Foreign Application Priority Data

Jan. 24, 1998 (KR) .................................................. 98-2240

(51) Int. Cl.[7] .................................................. H01L 21/268
(52) U.S. Cl. .................... 438/487; 438/795; 438/799; 148/DIG. 90; 148/DIG. 93
(58) Field of Search ...................... 117/3; 438/378, 438/487, 166, 795, 799; 148/DIG. 90, DIG. 93

(56) References Cited

U.S. PATENT DOCUMENTS

| | | | |
|---|---|---|---|
| Re. 36,371 | * 11/1999 | Imahashi et al. | .......................... 427/8 |
| 5,529,951 | * 6/1996 | Noguchi et al. | ...................... 438/487 |
| 5,981,974 | * 11/1999 | Makita | ..................................... 257/72 |
| 6,080,643 | * 6/2000 | Noguchi et al. | ...................... 438/487 |

FOREIGN PATENT DOCUMENTS

401212465 * 8/1989 (JP) .
401212481 * 8/1989 (JP) .

* cited by examiner

*Primary Examiner*—Benjamin L. Utech
*Assistant Examiner*—Donald L. Champagne
(74) *Attorney, Agent, or Firm*—Long Aldridge & Norman LLP (57) ABSTRACT

A method of dehydrogenating from and crystallizing a hydrogenated amorphous silicon layer by applying a laser beam having an improved profile which can process simultaneously dehydrogenation and crystallization on the amorphous silicon layer. The present invention including the step of scanning a laser beam with a predetermined overlap ratio onto amorphous silicon further includes the steps of carrying out dehydrogenation and crystallization simultaneously by means of controlling a scan length and a profile of the laser beam without damage on the amorphous silicon caused by hydrogen, wherein a variation rate of energy density of the laser beam in an energy density increasing region.

16 Claims, 7 Drawing Sheets

METHOD OF CRYSTALLIZING AMORPHOUS SILICON LAYER

BACKGROUND OF THE INVENTION

1. Field of the Invention

The present invention relates to a method of crystallizing an amorphous silicon layer by simultaneous dehydrogenation and crystallization using a laser beam having a predetermined profile.

2. Discussion of the Related Art

An amorphous silicon layer may be crystallized when treated with energy from a laser or the like, during which process the silicon layer melts and subsequently crystallizes when cooled. Crystallization occurs via a grain growth process where small crystal seeds which was not melted by the laser energy grow to form large crystals. When a plurality of seeds are present at different locations of the unmelted silicon, the seeds grow to form polycrystalline silicon.

Each grain of the polycrystalline silicon formed by this process has its own boundaries. When polycrystalline silicon is used as the channel region of a semiconductor device, the charge carrier mobility is typically low due to the grain boundary effect arising from the carriers having to pass through the boundaries between the grains.

In a liquid crystal display (LCD) device having thin film transistors (TFT) formed of low temperature polycrystalline silicon, active layers of TFTs are formed by depositing an amorphous silicon layer by plasma enhanced chemical vapor deposition (PECVD) and by subsequently annealing or crystallizing the amorphous silicon layer using a laser annealing technique.

A first prior art method comprises depositing an amorphous silicon layer using PECVD and subsequently crystallizing the amorphous silicon layer using laser annealing. The PECVD process results in an amorphous silicon layer containing about 15% hydrogen. Dehydrogenation is carried out by thermally treating the hydrogen-containing amorphous silicon layer at a temperature over 400° C., before the laser annealing step. The thermal dehydrogenation process requires additional equipment such as a furnace or the like and typically takes about five hours. As a result, productivity is low and the cost is high. Moreover, the thermal annealing treatment using a furnace causes damages to metal structures, such as hill-lock and the like, in semiconductor devices where a metal layer lies below the silicon layer.

In a second prior art method, the amorphous silicon layer is formed by low pressure chemical vapor deposition (LPCVD) and has relatively low hydrogen content. The amorphous silicon layer is laser-annealed without a dehydrogenation process. This method results in silicon layers having a smooth surface because of the low hydrogen content of the amorphous silicon layer, but suffers from low productivity. In addition, the glass substrate used in the semiconductor device is deformed due to the relatively high temperature during the LPCVD process (over 500° C.). Thus, new equipment and techniques are necessary for forming amorphous silicon layers at low temperatures and having low hydrogen content.

SUMMARY OF THE INVENTION

Accordingly, the present invention is directed to a method of crystallizing an amorphous silicon layer that substantially obviates one or more of the problems due to limitations and disadvantages of the prior art.

An object of the present invention is to provide a method for simultaneously dehydrogenating and crystallizing a hydrogenated amorphous silicon layer by applying a laser beam having an improved profile.

Another object of the present invention is to provide a method for releasing hydrogen from an amorphous silicon layer without damages thereto by scanning the amorphous silicon layer with laser energy having a slow-varying energy level, and simultaneously crystallizing the amorphous silicon layer. The slow-varying energy level may be obtained by reducing the overlap interval in a leading region of the profile of the laser beam used for crystallization.

Additional features and advantages of the invention will be set forth in the description which follows and in part will be apparent from the description, or may be learned by practice of the invention. The objects and other advantages of the invention will be realized and attained by the structure particularly pointed out in the written description and claims hereof as well as the appended drawings.

To achieve these and other advantages and in accordance with purposes of the present invention, as embodied and broadly described, a method according to the present invention includes the steps of applying a laser beam having a predetermined profile to an amorphous silicon layer in a single scan to accomplish both dehydrogenation and crystallization.

According to another respect of the present invention, dehydrogenation and crystallization are carried out simultaneously without damage to the amorphous silicon caused by hydrogen escaping from the silicon, by controlling the scan length and the profile of the laser beam, including the variation rate of energy density of the laser beam in the leading region of the energy profile.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this application, illustrate embodiments of the invention and together with the description serve to explain the principle of the invention.

In the drawings.

DETAILED DESCRIPTION OF THE PREFERRED EMBODIMENTS

Reference will now be made in detail to the preferred embodiment of the present invention, examples of which are illustrated in the accompanying drawings.

The crystallization of an amorphous silicon layer typically involves applying a laser beam of predetermined energy to the amorphous silicon layer to melt the layer, and subsequently crystallizing the melted silicon layer.

Figure 3:
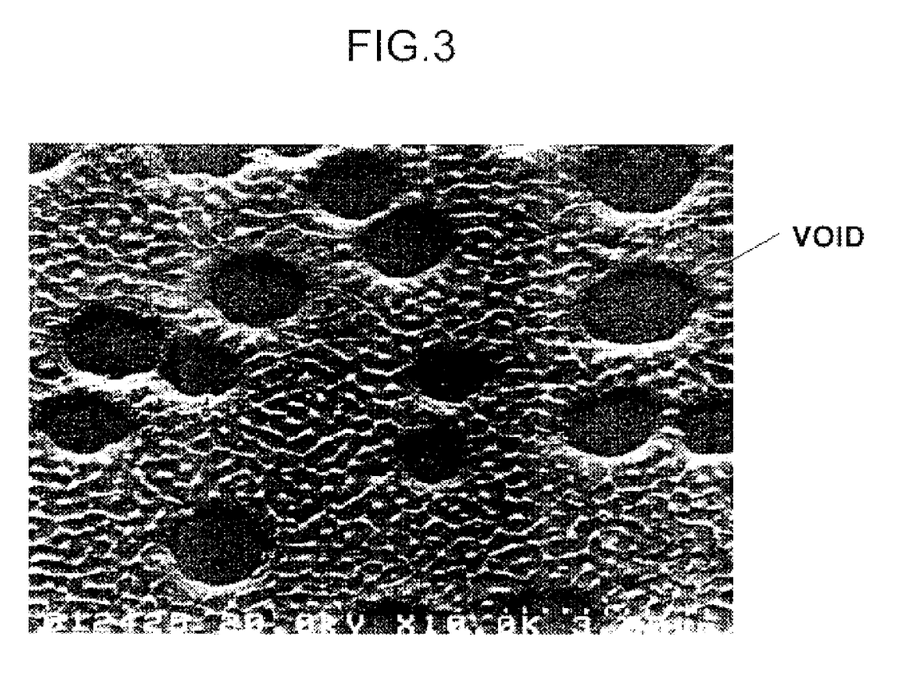
FIG. 3 shows the state of a silicon layer which has been dehydrogenated and crystallized simultaneously by a laser beam having high energy density.

In general, an amorphous silicon layer formed by plasma enhanced chemical vapor deposition (PECVD) has a hydrogen content of about 15%. In order to crystallize such an amorphous silicon layer according to the prior art, a dehydrogenation process must be carried out first by thermal annealing or the like at a temperature of over 400° C. The reason for this is that if an amorphous silicon layer having high hydrogen content is subjected to a laser beam having an energy level sufficient to melt the silicon and to initiate polycrystal growth in the silicon, the hydrogen will escape from the melted silicon layer explosively, causing damages to the silicon layer. FIG. 3 shows a silicon layer which is damaged due to abrupt dehydrogenation and, where large voids are formed.

Figure 1:
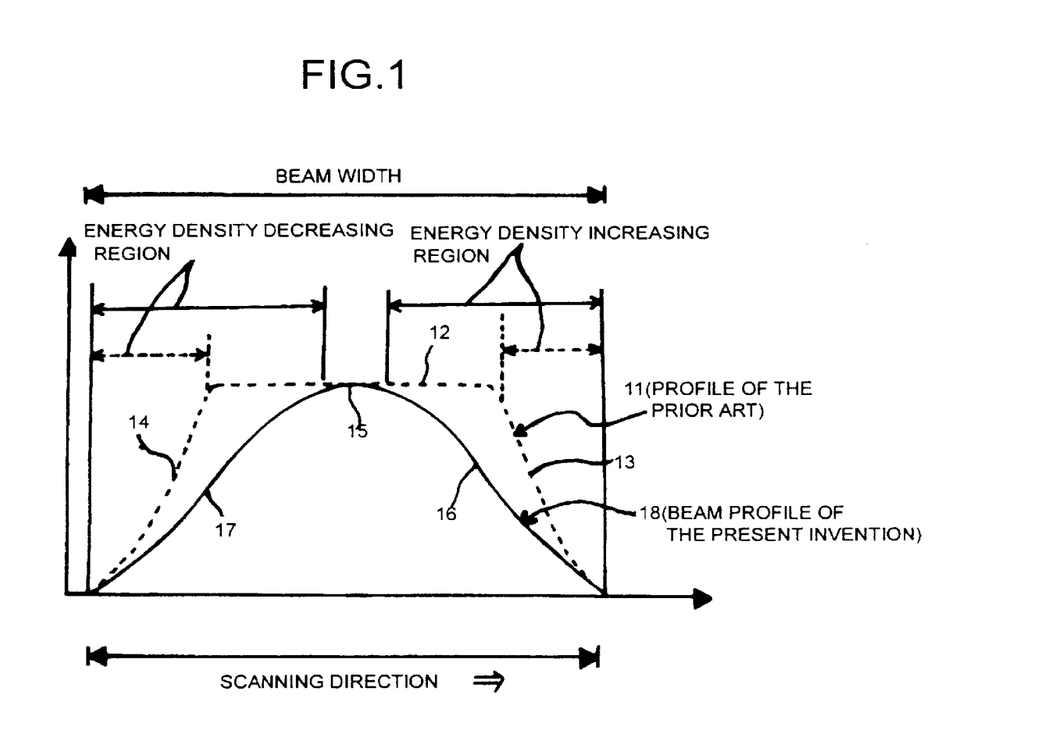
FIG. 1 is a graph which compares the laser beam profile of a prior technique and that of an embodiment of the present invention.

FIG. 1 is a graph which compares a laser beam profile used in a prior technique and the laser profile used in a method according to the present invention. Referring to FIG. 1, the prior art laser energy profile (the dashed curve) 11 has a flat peak region 12, a leading region (or energy density increasing region) 13 to the right of the flat peak region 12, and a trailing region 14 to the left of the flat peak region 12. The direction of the laser scan is from left to right. The energy level of the flat peak region 12 is sufficient to melt the amorphous silicon layer for recrystallization. The slope of the leading region 13 is steep, and the energy reaches the peak level relatively fast during the scan. Accordingly, if a laser beam having such an energy profile is applied to an amorphous silicon layer prior to dehydrogenation, the silicon layer will be damaged by an explosive escape of hydrogen due to an instant supply of excessive laser energy.

The profile 18 shown in FIG. 1 is a laser energy profile according to an embodiment of the present invention. The laser profile 18 has a peak 15, a leading region (energy density increasing region) 16 to the right of the peak 15 and a trailing region 17 to the left of the peak 15. The slope of the leading region 16 is much less steep than that of the leading region 13 of the prior art laser profile 11. When a laser beam having the profile 18 is applied to an amorphous silicon layer, the silicon layer starts to melt down with a lower hydrogen content of the melted silicon due to a less degree of crystallization. The dehydrogenation process proceeds in a controlled manner from the upper part of the silicon layer gradually to the lower part thereof as the laser energy level slowly increases.

Thus, in the present invention, the hydrogen content of melted silicon is reduced by decreasing the rate of energy density increase in the leading region of the energy profile when an amorphous silicon layer is melted down. The hydrogen in the silicon layer, which receives less energy than it does in the prior art process, is extracted from the layer gradually in a controlled manner while crystallization is carried out. This reduces or eliminates damages to the silicon layer due to explosive hydrogen escape.

Figure 2:
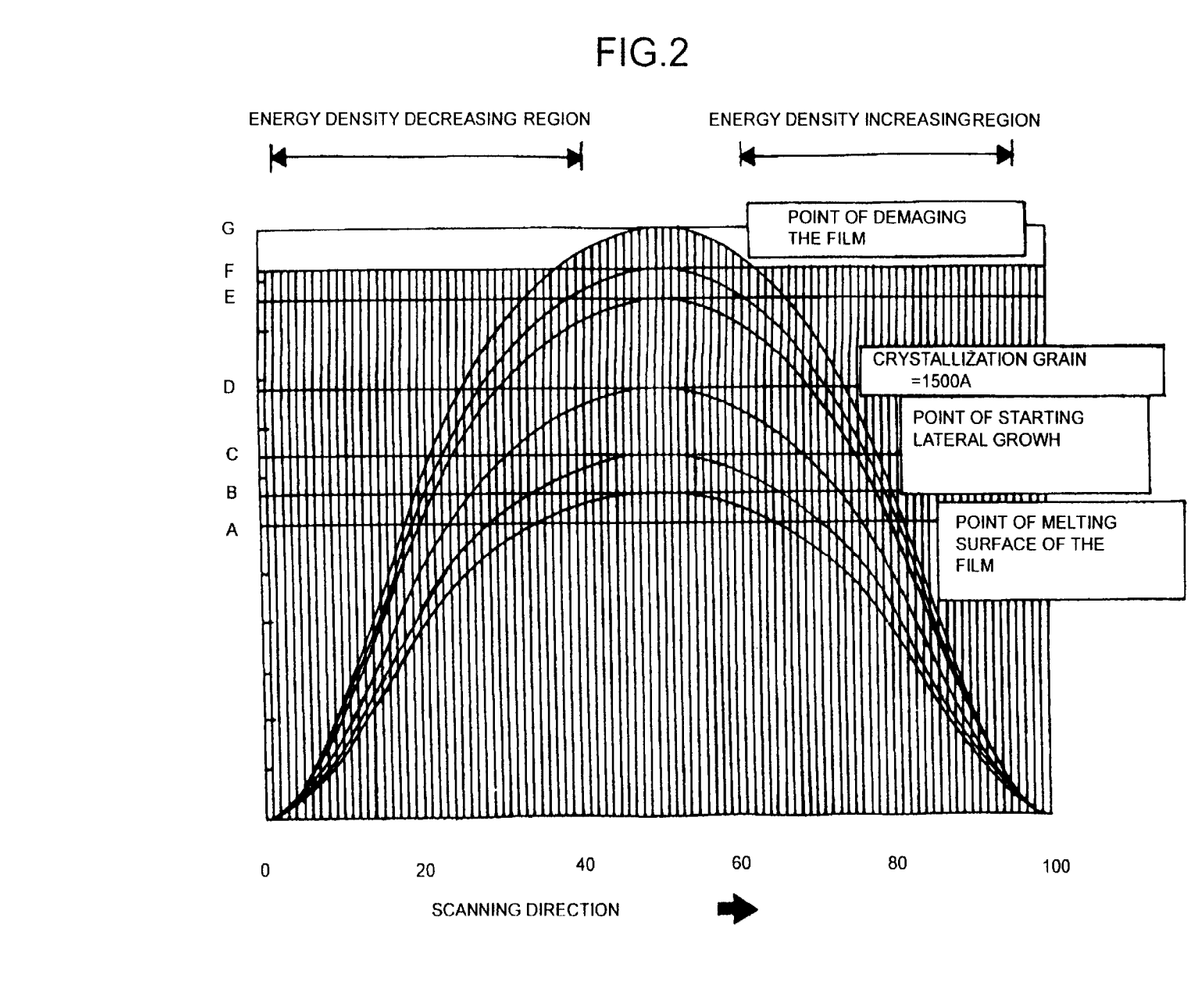
FIG. 2 shows laser beam profiles according to a first embodiment of the present invention.

In the present embodiment, in order to increase productivity and reduce damages caused by hydrogen escape, the initial energy variation rate applied to the silicon layer is optimized by minimizing the slope of the leading region 16 of the laser profile, and the overlap ratio of the laser beam during the scan is reduces as much as possible, FIG. 2 shows a series of laser beam profiles having a Gaussian shape according to a first embodiment of the present invention. The horizontal axis represents the direction of the beam width (from left to right), and the unit (1 to 100) represents the scanning steps. In other words, successive laser pulses overlap over 99% of their widths. The overlap length (or scan length, i.e., the size of the scan steps) can be calculated from the overlap ratio (99%) and the width of a laser beam. The vertical axis represents the laser energy density in a linear scale.

As shown in FIG. 2, the level "A" on the vertical axis represents the energy density level at which the top surface of the amorphous silicon layer stats to melt; "C" represents the energy density level at which lateral crystal growth starts; "D" represents the energy density level at which the grain sizes of the formed polycrystalline silicon is about 1500; and "G" represents another energy density level for damaging the polycrystalline silicon layer.

When an amorphous silicon layer is irradiated with a laser beam having an energy density level between the levels A and C, vertical growth of crystals occurs since the lower interface of the silicon layer has not been melted due to the low energy density. Accordingly, unmelted silicon regions remain at the lower interface of the layer, and a certain amount of hydrogen also remain in that region.

When the amorphous silicon layer is irradiated with a laser beam having an energy density level between the levels C and F, the expansion of grains in the silicon layer is achieved by lateral growth and damages caused by escaped hydrogen are little. In this situation, the top surface of the silicon layer begins to melt first, and dehydrogenation and crystallization occur gradually to a point where the grain sizes reach about 400 nm due to lateral growth caused by increased energy density, resulting in little or no damages to the silicon layer by the escaped hydrogen.

When the amorphous silicon layer is irradiated with a laser beam having an energy density level over the level G, voids are generated and the layer becomes rough. This is caused by a portion of the silicon layer being separated from the rest of the layer due to the escaped hydrogen which has received high energy. Such a silicon layer is illustrated in FIG. 3.

According to the present invention, a laser beam of having a predetermined energy density profile is applied to the silicon layer. The rate of variation of the laser energy is minimized by using a laser profile having a leading region that is slow-rising. As a result, the hydrogen escapes (i.e., is released) from the silicon layer gradually without causing damage to the silicon layer.

Figure 4:
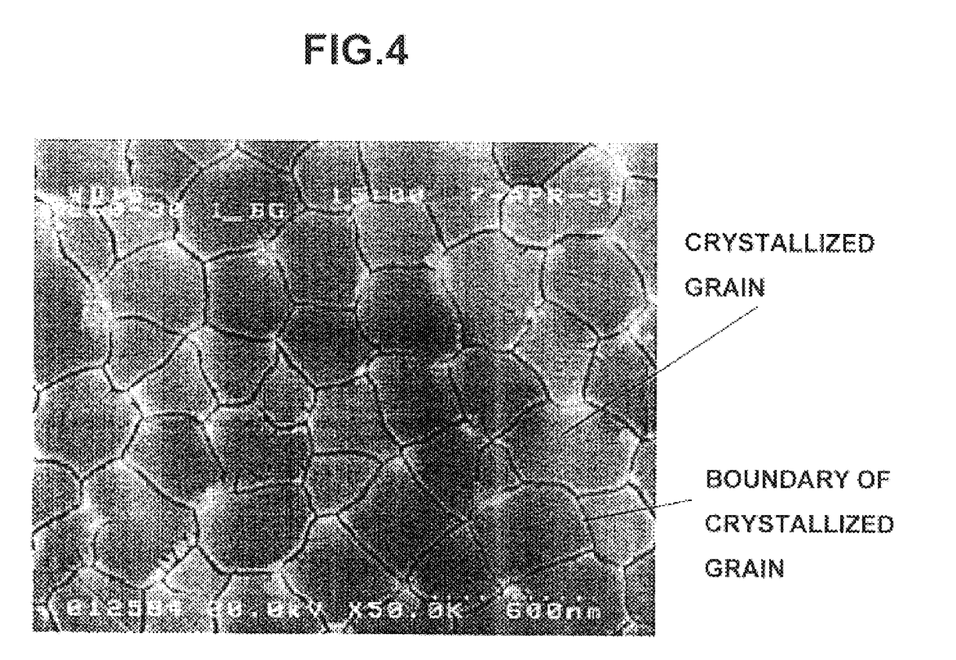
FIG. 4 shows a state of a polycrystalline layer which has been dehydrogenated and crystallized simultaneously by a laser with proper energy density according to the present invention.
Figure 5:
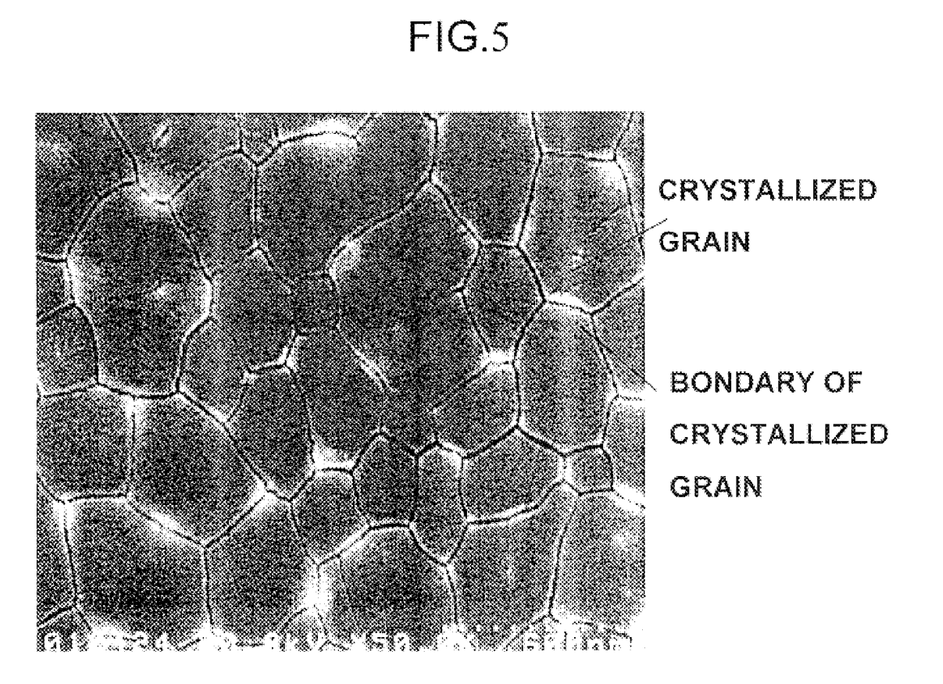
FIG. 5 shows the state of a silicon layer after dehydrogenation according to a prior technique.

FIGS. 3–5 are SEM images of crystallized silicon layers formed from amorphous silicon layers.

FIG. 3 shows a polycrystalline silicon layer formed by crystallization without a dehydrogenation process before a laser beam of high energy density is applied to the amorphous silicon layer. Damages to the silicon layer such as voids and the like caused by hydrogen are visible in the SEM image.

FIG. 4 shows a polycrystalline silicon layer formed by a process according to the present invention, where the amorphous silicon layer is dehydrogenated and crystallized simultaneously using a laser beam having a Gaussian profile.

FIG. 5 shows a polycrystalline silicon layer formed by crystallization using a prior technique where a laser crystallization is followed by a thermal dehydrogenation process.

Comparing FIGS. 3–5, the polycrystalline silicon layer formed using the method according to the present invention (FIG. 4) has large and uniform grain sizes without damages caused by hydrogen. Such a layer is comparable in quality to the polycrystalline silicon layer formed by the prior art method (FIG. 5). Therefore, the method according to the present invention provides high-quality polycrystalline silicon layers without the separate thermal dehydrogenation process required by the prior art method.

Figure 6:
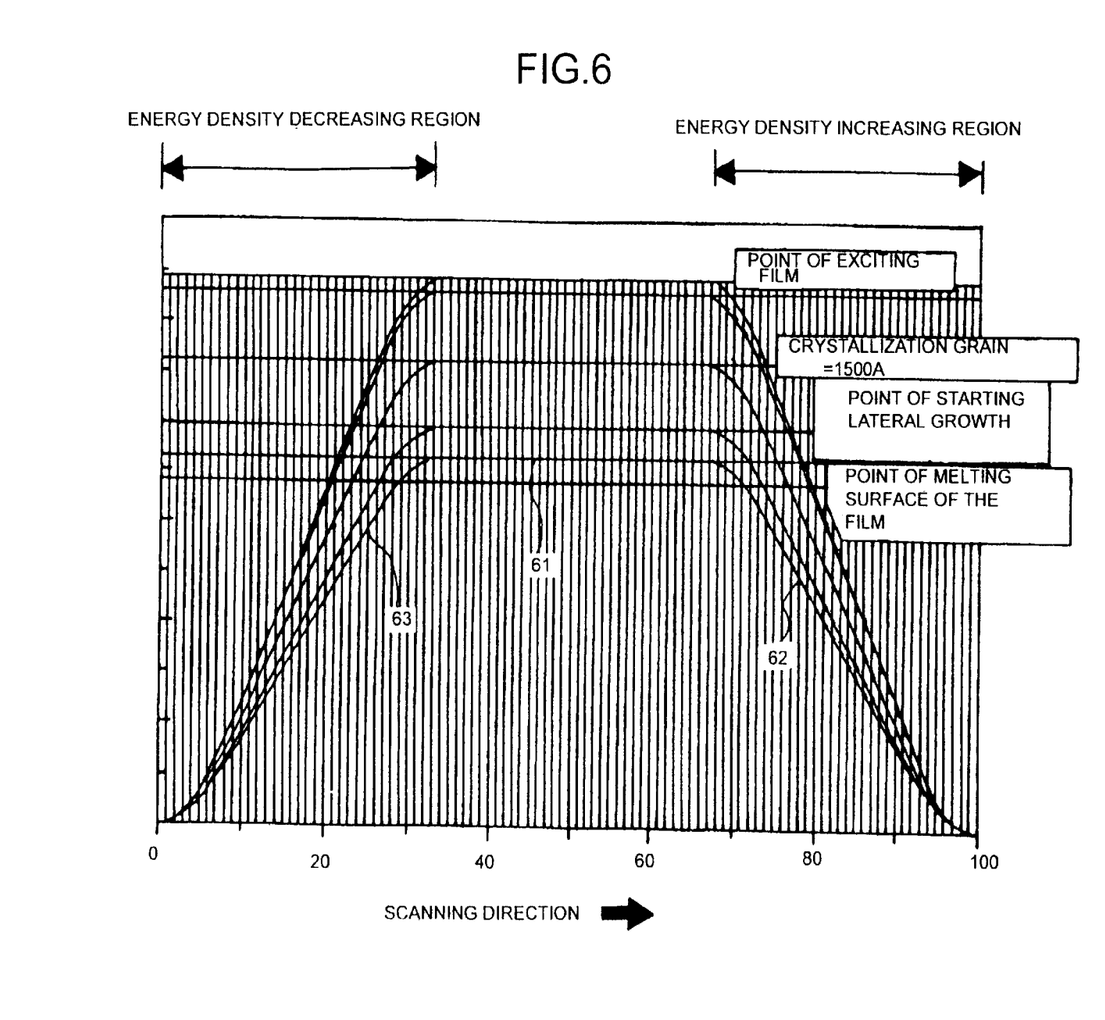
FIG. 6 shows the laser beam profiles according to a second embodiment of the present invention.

FIG. 6 shows a series of laser beam profiles each having flat peak region 61 according to a second embodiment of the present invention. Each laser profile also has a leading region 62 to the right of the peak region 61, and a trailing region 63 to the left of the peak region. The graph in FIG. 6 is otherwise similar to the graph in FIG. 2.

In FIG. 6, the level "A" on the vertical axis represents the energy density level at which the top surface of the amorphous silicon layer stats to melt; "C" represents the energy density level at which lateral crystal growth starts; "D" represents the energy density level at which the grain sizes of the formed polycrystalline silicon is about 1500; and "F" represents another laser energy density level for damaging the polycrystalline silicon layer.

Referring to FIG. 6, a laser beam having a peak energy density below the level E is used in the crystallization process according to the second embodiment. The variation rate of laser energy applied to the silicon layer is minimized by reducing the slope of the leading region 62 of the energy profile. The top surface of the silicon layer begins to melt, and dehydrogenation and crystallization occur gradually to a point where lateral growth develops as a result of increased energy density. The hydrogen escapes from the silicon layer gradually without causing damage thereto.

Compared to the Gaussian profile (FIG. 2), the flat-peak profile shown in FIG. 6 has a larger slope in the leading region. Consequently, a flat-peak beam that has the same peak energy density and beam width as a Gaussian-profile beam will have a larger energy density increase ratio per laser pulse during a scan than the Gaussian beam does. The process window is also smaller for the flat-peak beam as compared to a Gaussian beam, as the range of energy density which enables simultaneous dehydrogenation and crystallization without hydrogen damage is small.

Figure 7:
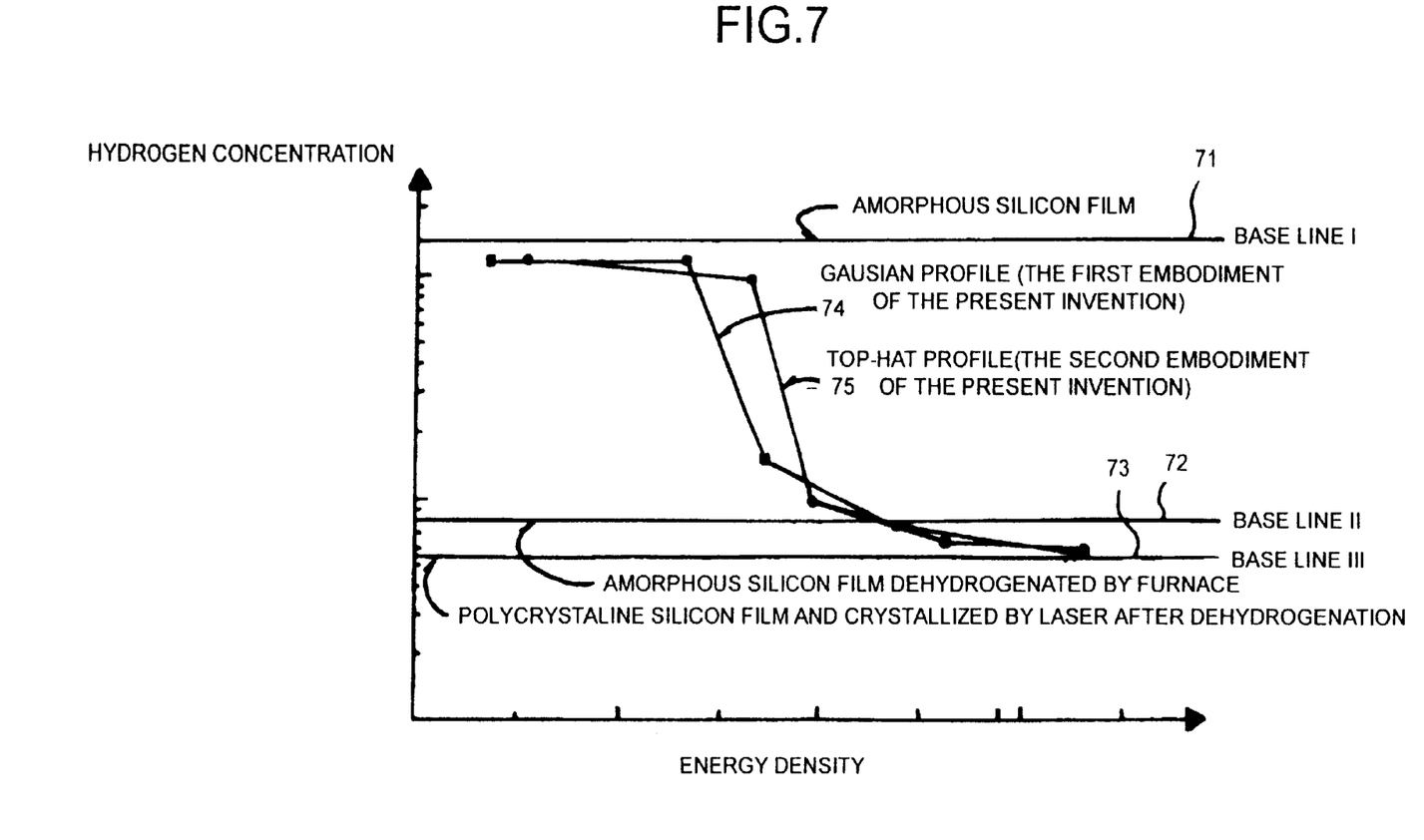
FIG. 7 is a graph showing the hydrogen content of a silicon layer crystallized using a method according to the present invention.

FIG. 7 illustrates the hydrogen content of a polycrystalline silicon layer formed by the simultaneous dehydrogenation and crystallization process according to the present invention. In FIG. 7, a first base line 71 represents the hydrogen content of a silicon layer deposited using PECVD prior to any dehydrogenation. A second base line 72 represents the hydrogen content of the PECVD-deposited silicon layer after dehydrogenation using a prior art thermal annealing method, and a third base line 73 represents the hydrogen content of the polycrystalline silicon layer formed by laser annealing following the thermal dehydrogenation.

Curves 74 and 75 in FIG. 7 illustrate the hydrogen content of a polycrystalline silicon layer formed from a PECVD-deposited silicon layer using the simultaneous dehydrogenation and crystallization process of the present invention. The horizontal axis of the graph represents the peak energy density of the laser beam used in the process. The curves 74 and 75 illustrate the results when a laser beam having a Gaussian profile and a flat-peak profile is used, respectively. These curves show that the hydrogen content of the polycrystalline silicon layer formed by the process of the present invention is similar to that of a polycrystalline silicon layer formed by the prior art method of separate dehydrogenation and crystallization.

Although a Gaussian profile and a flat-peak profile are illustrated in the two embodiments described above, laser beams having other energy profiles may be used to practice the present invention. For example, the laser beam may have an asymmetric energy profile where the leading region has a slow-rising slope to avoid hydrogen damage during dehydrogenation, and the peak and trailing regions have energy densities that are favorable for crystallization.

In summary, the laser crystallization method of the present invention enables simultaneous dehydrogenation and crystallization of an amorphous silicon layer using a single laser scan. This is achieved by using a laser beam profile that has a slow-rising leading region or by reducing the energy density variation per laser pulse during the scan.

The present invention eliminates a separate dehydrogenation processes and the associated apparatus, simplifying the fabrication process and shortening the manufacturing time. In addition, by eliminating the thermal dehydrogenation process, the method prevents damage to metal components in semiconductor structures that include metal as a lower part.

It will be apparent to those skilled in the art that various modifications and variations can be made in a method of crystallizing an amorphous silicon layer of the present invention without departing from the spirit or scope of the inventions. Thus, it is intended that the present invention cover the modifications and variations of this invention provided they come within the scope of the appended claims and equivalents.

What is claimed is:

1. A method for forming a polycrystalline silicon layer from an amorphous silicon layer containing hydrogen, comprising the step of:
   scanning a laser beam having an energy profile over the amorphous silicon layer once;
   wherein the energy profile has a leading region and a peak region the leading region has an energy selected to release the hydrogen from the silicon layer in a controlled manner and the peak region has an energy selected to crystallize the amorphous silicon layer to form the polycrystalline silicon layer during the same scan.

2. The method of claim, 1, wherein the polycrystalline silicon layer is substantially free from damages caused by the released hydrogen.

3. The method of claim 1, wherein the energy profile has a Gaussian shape.

4. The method of claim 1, wherein the energy profile has a flat peak.

5. The method of claim 1, wherein the energy profile is asymmetric.

6. A method of crystallizing an amorphous silicon layer, comprising:
   scanning a laser beam over the amorphous silicon layer; and
   carrying out dehydrogenation and crystallization simultaneously while avoiding damage to the amorphous silicon caused by hydrogen by controlling a scan length and an energy profile of the laser beam including a variation rate of energy density of the laser beam in a leading region of the profile.

7. The method of claim 6, wherein the energy profile of the laser beam has a Gaussian shape.

8. The method of claim 6, wherein the energy profile of the laser beam has a flat peak.

9. The method of claim 6, wherein the energy profile of the laser beam is asymmetric.

10. The method of claim 9, wherein the energy profile has a leading region with a slow-rising slope for dehydrogenation while avoiding damage to the amorphous silicon layer and has a peak region and a trailing region for crystallization of the amorphous silicon layer.

11. A method of crystallizing an amorphous silicon layer, comprising:

providing the amorphous silicon layer having hydrogen elements; and scanning a laser beam over the amorphous silicon layer to subject the amorphous silicon layer to dehydrogenation and crystallization while avoiding damage to the amorphous silicon caused by escaping hydrogen by controlling an energy profile of the laser beam, wherein the energy profile includes at least a leading region, a peak region, a trailing region, the leading region having an energy slope that gradually increases at a rate to avoid explosive dehydrogenation.

12. The method of claim 11, wherein when the laser beam is being scanned over the amorphous silicon layer, the peak region follows the leading region to melt a polycrystalline silicon layer, wherein the polycrystalline silicon layer being formed by crystallizing the amorphous silicon layer at the leading region of the laser profile.

13. The method of claim 11, wherein the peak region of the energy profile has a substantially constant peak value 14. The method of claim 11, wherein the leading region and the trailing region of the energy profile of the laser beam are asymmetric to each other.

15. A method for forming a polycrystalline silicon layer, the method comprising the steps of:

depositing an amorphous silicon layer on a surface, said amorphous silicon layer having a thickness;

selecting a scan rate of a laser beam;

selecting a laser beam energy profile, said profile including a leading region and a peak region, said leading region being selected to substantially dehydrogenize the amorphous silicon layer without damaging the amorphous silicon layer in a single scan of the laser beam at the scan rate and said peak region being selected to crystallize the amorphous silicon layer in a single scan of the laser beam at the scan rate; and irradiating the amorphous silicon layer with the laser beam a single time at the scan rate with the selected energy profile.

16. A method for forming a semiconductor device, the method comprising the steps of:

forming an amorphous silicon layer on a surface of the device, said amorphous silicon layer having a thickness;

selecting a scan rate of a laser beam;

selecting a laser beam energy profile, said profile including a leading region and a peak region, said leading region being selected to substantially dehydrogenize the amorphous silicon layer without forming voids in the amorphous silicon layer in a single scan of the laser beam at the scan rate and said peak region being selected to crystallize the amorphous silicon layer in a single scan of the laser beam at the scan rate; and irradiating the amorphous silicon layer once with the laser beam at the scan rate with the selected energy profile.

* * * * *